United States Patent [19]

Evans

[11] Patent Number: 5,146,176

[45] Date of Patent: Sep. 8, 1992

[54] AMPLIFIER CIRCUIT WITH INPUT ERROR COMPENSATION

[75] Inventor: Thomas G. Evans, Limbury, United Kingdom

[73] Assignee: E. C. Audio Limited, Daneshill, England

[21] Appl. No.: 623,984

[22] PCT Filed: Apr. 19, 1989

[86] PCT No.: PCT/GB89/00415

§ 371 Date: Dec. 17, 1990

§ 102(e) Date: Dec. 17, 1990

[87] PCT Pub. No.: WO89/10656

PCT Pub. Date: Nov. 2, 1989

[30] Foreign Application Priority Data

Apr. 19, 1988 [GB] United Kingdom ............... 8809206

[51] Int. Cl.⁵ ............................ H03F 3/45; H03F 3/68
[52] U.S. Cl. ........................................ 330/69; 330/84; 330/295

[58] Field of Search ................... 330/69, 84, 149, 295

[56] References Cited

U.S. PATENT DOCUMENTS 3,768,033 10/1973 Lowe ..................................... 330/84

Primary Examiner—James B. Mullins
Attorney, Agent, or Firm—Weingarten, Schurgin, Gagnebin & Hayes

[57] ABSTRACT

An analogue amplifier circuit has a gain stage comprising two differential operational amplifers (17, 18) and an error correction stage comprising two differential operational amplifiers (20, 21) each connected with its inputs across the inputs of a respective gain stage amplifier and its output connected to the non-inverting input of the other gain stage amplifier. A balanced output from the outputs of the two gain stage amplifiers (17, 18) may be provided or these two outputs may be fed to a final stage amplifier (22) to provide a single output.

10 Claims, 2 Drawing Sheets

AMPLIFIER CIRCUIT WITH INPUT ERROR COMPENSATION

The present invention relates generally to an analogue amplifier circuit suitable for a wide range of uses.

It is widely known that analogue amplifier circuits using differential operational amplifiers have a disadvantage due to the inherent error voltage which appears across the inputs of the differential operational amplifier. As used hereinafter, the term "operational amplifier" will be understood to refer to a differential operational amplifier.

Operational amplifiers have an inverting input and a non-inverting input. The error voltage arises because in practice the amplifier has a finite gain so that a voltage always appears at the inverting input of the amplifier with respect to the non-inverting input. This error voltage results in distortion, particularly at low frequencies, which makes the operational amplifier unsuitable for circumstances where high fidelity in the amplified signal is required. This is unfortunate since operational amplifiers are ideally suited for use with a balanced line input and a balanced line input is almost invariably required for high precision applications such as in medical apparatus and the like.

Various attempts have been made to compensate for the error voltage appearing across the inputs of an operational amplifier, usually achieved by the use of a compensating voltage applied to the output of the amplifier. The present invention seeks to provide an amplifier circuit incorporating an error-correction stage which does not involve the application of a compensating voltage to the output of a gain stage of the amplifier, but rather which acts to apply compensation at the input stage thereof.

According to the present invention, therefore, there is provided an analogue amplifier circuit having a gain stage including two operational amplifiers, in which the input error of at least one of the operational amplifiers is compensated by an error correction stage comprising at least one operational amplifier the inputs of which are connected across the inputs of the said one amplifier of the gain stage and the output of which is connected to the input of the other amplifer of the gain stage.

Preferably the inverting input of the operational amplifier of the error correction stage is connected to the non-inverting input of the said one operational amplifier of the gain stage.

Such a circuit is particularly suitable for use in a single line input mode which is effected by earthing one of two lines of a balanced input applied across the inputs of the two amplifiers of the gain stage.

Preferably the output of the operational amplifier of the error correction stage is connected to the non-inverting input of the said other operational amplifier of the gain stage.

For use with a balanced line input a symmetrical configuration is preferably employed in which the said error correction stage includes a second operational amplifier the inputs of which are connected across the inputs of the said other operational amplifier of the gain stage and the output of which is connected to the input of the said one amplifier of the gain stage. Such a symmetrical configuration thus acts to provide a compensating input to each input of a gain stage operational amplifier to compensate for its inherent error voltage.

The two outputs of the two operational amplifiers of the gain stage may provide a balanced line output, but if a single line output is required a final output stage may be provided having differential inputs connected to respective outputs of the said two operational amplifiers of the gain stage.

In preferred embodiments of the invention the output of the second operational amplifier of the error correction stage is connected to the non-inverting input of the said one operational amplifier of the gain stage and the inverting input of the second operational amplifier of the error correction stage is connected to the non-inverting input of the said other amplifier of the gain stage. Likewise it is preferred that the output of each operational amplifier of the error correction stage is connected to the inverting input of the other operational amplifier of the error correction stage. This ensures that the desired gain is achieved by equating the loop gain to unity which leaves a compensation requirement of a forward gain of unity with a feedback gain also of unity. These conditions are independent of the overall gain of the amplifier circuit, the overall sign of the gain or the mode of operation, that is whether it is differential, single line input or balanced line input.

Three embodiments of the present invention will now be more particularly described, by way of example, with reference to the accompanying drawings, in which.

Figure 1:
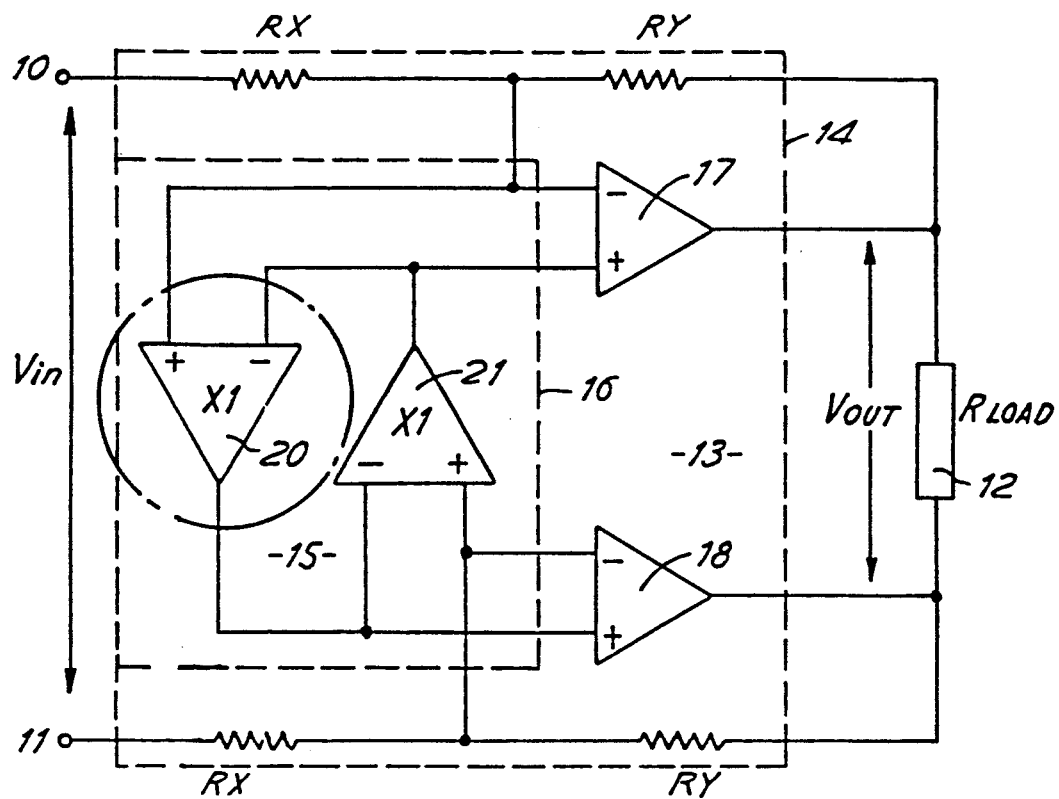
FIG. 1 is a schematic circuit diagram of a balanced line input amplifier formed as a first embodiment of the present invention.

The circuit shown in FIG. 1 has input terminals 10 and output terminals 11, supplying a load 12, and is physically and operationally symmetrical about an axis running horizontally through the circuit. It has a gain stage 13 within the dashed line 14, and an error correction stage 15 within dashed line 16. Each stage includes two operational amplifiers 17, 18 and 20, 21, respectively. These may be as produced by National Semiconductors, ref LM329.

Figure 1A:
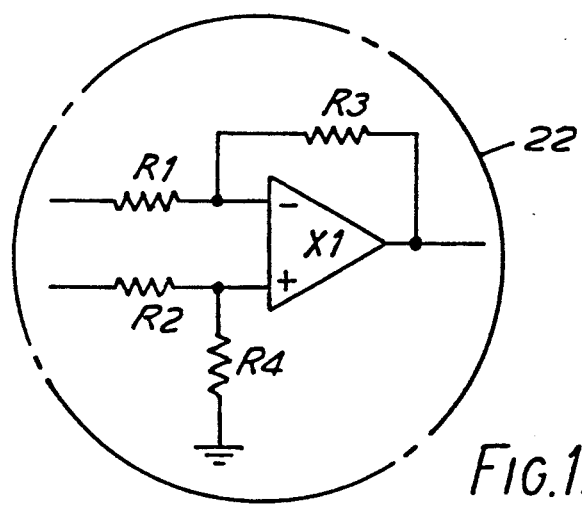
FIG. 1A is a schematic circuit diagram illustrating a detail of FIG. 1.

Each amplifier 20, 21 is connected in a standard circuit configuration, illustrated in FIG. 1A at 22, with four resistors R1 to R4. The gain of such a circuit is R1/R3, and in the present instance for amplifiers 20, 21 is set to 1, i.e. R1=R3.

The amplifiers 17, 18 are seen to lie in a similar circuit configuration, but with a positive gain defined by RX/RY which can be decided at will. These two amplfiers lie in parallel across the input 10, 11 and the common load 12.

The amplifiers 20, 21 are connected in a feedback loop, and their non-inverted and inverted inputs are also connected across the inverted and non-inverted terminals, respectively, of the amplifiers 17, 18, respectively, of the gain stage 13.

It is a known feature of operational amplifiers that an error signal appears at the inverting input on application of an input voltage. Normally, this produces distortion of an analogue signal, which would make the amplifier unusable in normal analogue gain circuits, such as audio or video amplifiers, for which exact reproduction is required.

The circuit described above overcomes this disadvantage to provide linear analogue gain. This can be admirably illustrated by the very stringent test of amplifying a square wave signal. Normally, there is considerable overshoot followed by oscillation at the rising and falling flanks of the amplified signal. Using the present circuit, the amplified signal is a near perfect reproduction of the input, without any such distortions The reasons why the circuit achieves this are unclear, since analysis of the operation of the error correcting stage is extremely difficult.

In a slight modification an R-C circuit may be added in the feedback line with RY of the amplifiers 17, 18. This is useful for phono cartridge equalisation.

It will be appreciated, for perfect linearity a similar error correction circuit would be required for the differential operational amplifiers 20, 21 since they, like the gain stage amplifiers 17, 18, also have an inherent error voltage across their inputs. However, since the error in the output of the amplifiers 20, 21 is only an error in the compensating voltage this is a second order effect and can be considered of minor importance.

Figure 2:
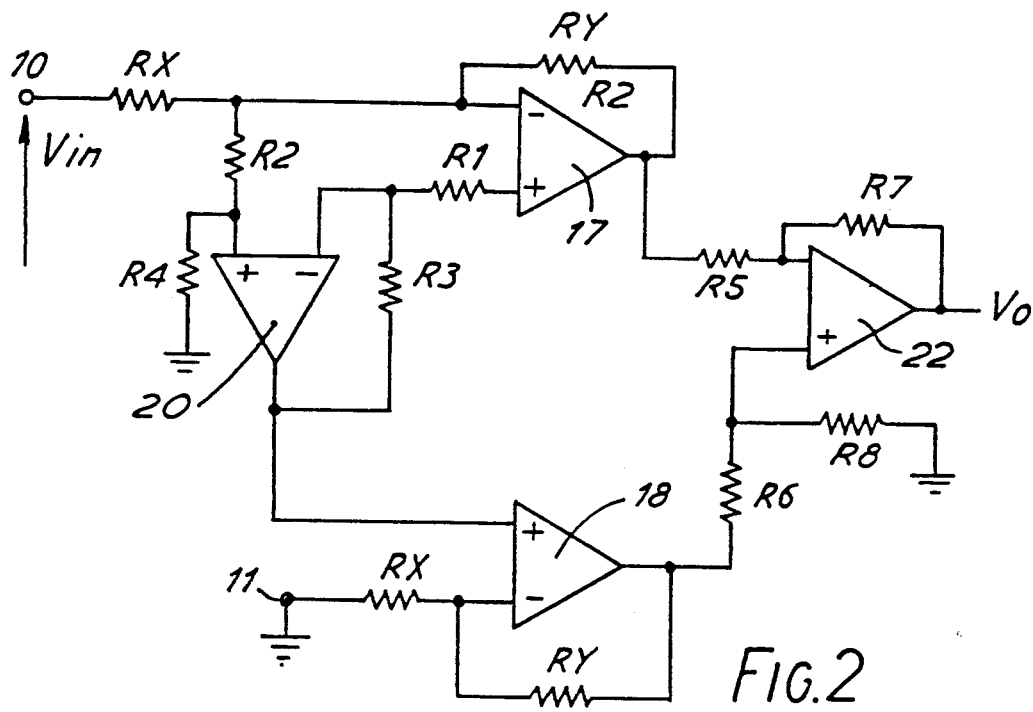
FIG. 2 is a circuit diagram illustrating a second embodiment of the present invention adapted for a single line input and single line output.

Referring now to FIG. 2 an alternative embodiment adapted for a single line input and a single line output is shown. In this figure elements having the same or corresponding function to corresponding elements in the embodiment of FIG. 1 have been identified with the same reference numerals. In the circuit of FIG. 2 the input voltage is applied only to terminal 10, and terminal 11 is grounded. This provides effectively a single line input which allows the omission of the amplifier 21 in the embodiment of FIG. 1 connected across the inputs of amplifier 18 since the error across the amplifier 18 can be regarded as negligible with the inverting input earthed via the terminal 11. The outputs from the amplifiers 17, 18 are fed via respective resistors R5, R6 to the inverting and non-inverting inputs of a further operational amplifier 22, which has a negative feedback resistor R7 connected between its output at the zero and the inverting input and a grounded resistor R8 connected between the non-inverting input and the resistor R6.

Figure 3:
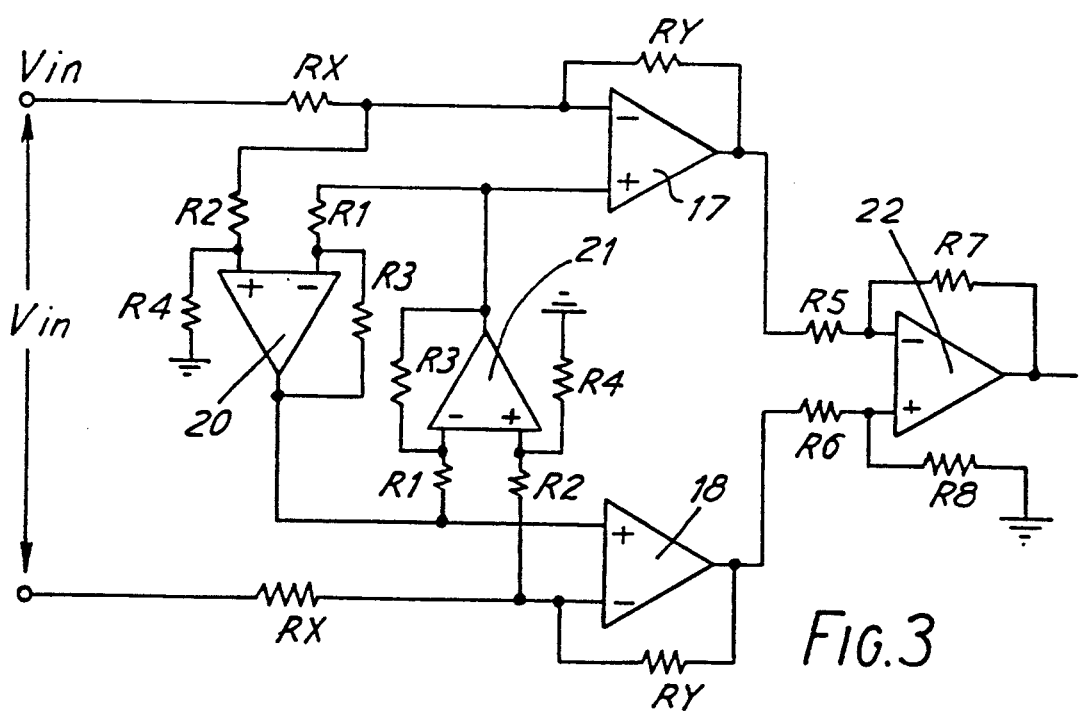
FIG. 3 is a circuit diagram illustrating a third embodiment of the invention adapted for a balance line input and single line output.

In the embodiment of FIG. 3 a balanced line input is amplified and converted to a single line output, and the individual components are identified with the same reference numerals as in the embodiments of FIGS. 1 and 2. In this embodiment two error correction amplifiers are provided to produce error correction signals supplied, in each case, to the non-inverting input of the main gain stage amplifier 17, 18 whilst the outputs of the two error correction amplifiers 18, 20 are each connected to the inverting inputs of the other error correction amplifier and the non-inverting inputs of the gain stage amplifiers. The amplifiers 18, 20 have unity gain so that there is unity loop gain and unity forward gain in the circuit to which the inputs of the two gain stage amplifiers are connected. The outputs of the two gain stage amplifiers 17, 18 are connected to respective inputs of a final stage amplifier 22 in a configuration similar to that of the embodiment of FIG. 2, namely with a non-inverting output. The final stage amplifier 22 could, of course, be reversed with the non-inverting input being connected to the output of amplifier 17 and the inverting input connected to the output of amplifier 18. Likewise, in other embodiments, a single line input mode may be achieved by earthing the terminal 11 as in the embodiment of FIG. 2, retaining the error correction amplifier 21.

I claim:

1. An analogue amplifier circuit having a gain stage including two operational amplifiers, each amplifier providing an output which is substantially a linear function of an input and wherein the input error of at least one of the operational amplifiers is compensated by an error correction stage for producing at least a first error correcting signal, the error correction stage comprising at least one operational amplifier the inputs of which are connected across the inputs of the said one operational amplifier of the gain stage and the output of which provides the first error correcting signal, and is connected to the input of the other operational amplifier of the gain stage.

2. An analogue amplifier circuit as claimed in claim 1, in which the inverting input of the operational amplifier of the error correction stage is connected to the non-inverting input of the said one operational amplifier of the gain stage.

3. An analogue amplifier circuit as claimed in claim 1, in which the output of the operational amplifier of the error correction stage is connected to the non inverting input of the said other operational amplifier of the gain stage.

4. An analogue amplifier as claimed in any of claims 1 2 or 3, in which the said error correction stage includes a second operational amplifier the inputs of which are connected across the inputs of the said other operational amplifier of the gain stage and the output of which is connected to the input of the said one amplifier of the gain stage.

5. An analogue amplifier as claimed in claim 4, in which the output of the second operational amplifier of the error correction stage is connected to the non-inverting input of the said one operational amplifier of the gain stage.

6. An analogue amplifier as claimed in claim 4, in which the inverting input of the second operational amplifier of the error correction stage is connected to the non-inverting input of the said other amplifier of the gain stage.

7. An analogue amplifier as claimed in claim 4, in which the output of each operational amplifier of the error correction stage is connected to the inverting input of the other operational amplifier of the error correction stage.

8. An analogue amplifier as claimed in claim 4, further including a final output stage having differential inputs connected to respective outputs of the said two operational amplifiers of the gain stage.

9. An analogue amplifier as claimed in claim 3, in which one of the two input lines of a balanced input is grounded such that the other input line acts as a single line input.

10. An analogue amplifier as claimed in claim 4, in which:

the output of the second operational amplifier of the error correction stage is connected to the non-inverting input of the said one operational amplifier of the gain stage;

the inverting input of the second operational amplifier of the error correction stage is connected to the non-inverting input of the said other amplifier of the gain stage;

the output of each operational amplifier of the error correction stage is connected to the inverting input of the other operational amplifier of the error correction stage; and a final output stage is provided having differential inputs connected to respective outputs of the said two operational amplifiers of the gain stage.

* * * * *

UNITED STATES PATENT AND TRADEMARK OFFICE
CERTIFICATE OF CORRECTION

PATENT NO. : 5,146,176
DATED : September 8, 1992
INVENTOR(S) : Thomas G. Evans

It is certified that error appears in the above-indentified patent and that said Letters Patent is hereby corrected as shown below:

Column 4, line 24, "1 2", should read --1, 2--.

Signed and Sealed this

Fifth Day of April, 1994

BRUCE LEHMAN

Attest:

Attesting Officer

Commissioner of Patents and Trademarks